United States Patent
Yoshida

(10) Patent No.: US 9,651,608 B2
(45) Date of Patent: May 16, 2017

(54) LIGHT-EMITTING DEVICE DIAGNOSTIC CIRCUIT

(71) Applicant: Nisho Image Tech Inc., New Taipei (TW)

(72) Inventor: Harunobu Yoshida, Ushiku (JP)

(73) Assignee: NISHO IMAGE TECH, INC., New Taipei (TW)

( * ) Notice: Subject to any disclaimer, the term of this patent is extended or adjusted under 35 U.S.C. 154(b) by 211 days.

(21) Appl. No.: 14/515,599

(22) Filed: Oct. 16, 2014

(65) Prior Publication Data

US 2015/0108988 A1 Apr. 23, 2015

(30) Foreign Application Priority Data

Oct. 18, 2013 (TW) .............................. 102219508 U

(51) Int. Cl.

| | |
|---|---|
| *G01R 3/00* | (2006.01) |
| *G01R 31/26* | (2014.01) |
| *B41J 2/165* | (2006.01) |
| *B41J 2/21* | (2006.01) |
| *H05B 37/03* | (2006.01) |
| *G01R 19/165* | (2006.01) |

(52) U.S. Cl.
CPC ...... *G01R 31/2635* (2013.01); *B41J 2/16579* (2013.01); *B41J 2/2142* (2013.01); *H05B 37/03* (2013.01); *G01R 19/165* (2013.01)

(58) Field of Classification Search
CPC ....... G01R 31/44; G01R 31/245; H01K 3/305
USPC ....................................................... 324/414
See application file for complete search history.

(56) References Cited

U.S. PATENT DOCUMENTS

| | | | | | |
|---|---|---|---|---|---|
| 5,557,207 | A | * | 9/1996 | Duve ..................... | G01R 31/24 324/133 |
| 5,754,036 | A | * | 5/1998 | Walker ................ | H02M 5/2573 323/235 |
| 7,459,903 | B1 | * | 12/2008 | Tsai ................. | G01R 19/16538 324/764.01 |
| 2007/0058312 | A1 | * | 3/2007 | Nishida ................ | H02H 11/005 361/93.1 |
| 2010/0244844 | A1 | * | 9/2010 | Veroni ................. | H05B 37/034 324/414 |
| 2013/0176031 | A1 | * | 7/2013 | Huang ............... | H05B 33/0893 324/414 |

* cited by examiner

*Primary Examiner* — Tung X Nguyen
*Assistant Examiner* — Dominic Hawkins
(74) *Attorney, Agent, or Firm* — McClure, Qualey & Rodack, LLP

(57) ABSTRACT

A diagnostic circuit for inspecting a light-emitting device having light-emitting elements. The diagnostic circuit includes a power source module, a buffer module, and an abnormality detection module. The buffer module includes a plurality of buffers. Each buffer has a buffer input terminal and a buffer output terminal. The buffer input terminal receives a first power source signal from the power source module, and the buffer output terminal outputs a second power source signal to one of the light-emitting elements. The abnormality detection module includes a plurality of comparators. Each comparator has a pair of detection input terminals and a detection output terminal. The detection input terminals is configured to receive the first and second power source signals. The detection output terminal outputs a comparison signal to generate a diagnostic result.

9 Claims, 6 Drawing Sheets

LIGHT-EMITTING DEVICE DIAGNOSTIC CIRCUIT

CROSS-REFERENCES TO RELATED APPLICATIONS

This non-provisional application claims priority under 35 U.S.C. §119(a) on Patent Application No. 102219508 filed in Taiwan, R.O.C. on 2013 Oct. 18, the entire contents of which are hereby incorporated by reference.

BACKGROUND

Technical Field

The instant disclosure relates to a light-emitting device diagnostic circuit, in particular, to a diagnostic circuit for detecting abnormal light-emitting device of the printer head for the printing devices.

Related Art

An light emitting diode (LED) is a light source based on the conversion of electrical energy to light energy. An LED's advantages include high efficiency and long service life, which allow the LED to be widely used amongst various fields. In addition to being used in large quantities for everyday activities, in recent years, LEDs are also making presence in 3C (computers/communications/consumers), products and small home appliances, such as LED screens, LED lamps, etc. Furthermore, some manufactures have applied LED technology to printers; for example, the replacement of the laser printer head by the LED printer head.

LED printers and laser printers have similar operating principles; specifically both types of printer adopt optical technology to convert digital data into light data. The light-sensitive drum then attracts the toner to make printed documents. However, LED printers are more advantageous than laser printers, since LED printers omit complicated optical structures, only using simple LED arrays cooperating with optical components. Consequently, LED printers save more space, in addition to having low distortion rate and high precision. However, one issue associated with LED printers is that if any LED in the LED printer head's array is abnormal or damaged, the printing quality will be adversely affected, and the abnormal part must be replaced. Consequently, to ensure the LEDs' light emitting quality and the printer performance, the testing of each LED of the printer head is critical. The conventional testing method involves supplying voltage directly to the LEDs, and inspecting the emitting status to check for any abnormality. However, whether by supplying voltages section-by-section or all at once, such an inspection method is relatively inconvenient.

SUMMARY

In light of this, the instant disclosure provides a diagnostic circuit for inspecting an abnormal light-emitting device. The diagnostic circuit is applicable for the printer heads of printing devices. Namely, the diagnostic circuit is used for inspecting the light-emitting elements of the printer head for the printing devices. The diagnostic circuit comprises a power source module, a buffer module, and an abnormality detection module. The power source module outputs a first power source signal. The buffer module includes a plurality of buffers, with each buffer having a buffer input terminal and a buffer output terminal. The buffer input signal receives the first power source signal. The buffer output terminal outputs a second power source signal corresponding to the first power source signal to one of the light-emitting elements. The abnormality detection module includes a plurality of comparators. Each comparator has a pair of detection input terminals and a detection output terminal. The detection input terminals are coupled to the buffer input terminal and the buffer output terminal of the corresponding buffer, respectively. Such a configuration is for receiving the first and second power source signals, along with detecting a comparison signal outputted by the detection output terminal. Based on the comparison signals, the abnormality detection module outputs the diagnostic result.

In accordance with the diagnostic circuit inspecting abnormal light-emitting device disclosed by the instant disclosure, an add-on circuit is employed to compare the incoming and outgoing power source signals of every buffer. Based on such an approach, each light-emitting element can be examined to determine whether an abnormality exists, and such an approach is more convenient than the conventional method.

The embodiments below provide detailed descriptions of the characteristics and advantages of the instant disclosure. The descriptions allow a person skilled in the art to understand the technical features of the instant disclosure. Based on the descriptions disclosed by the specification, claims, and drawings, a person skilled in the art can readily understand the purpose and advantages of the instant disclosure.

DETAILED DESCRIPTION

Figure 1:
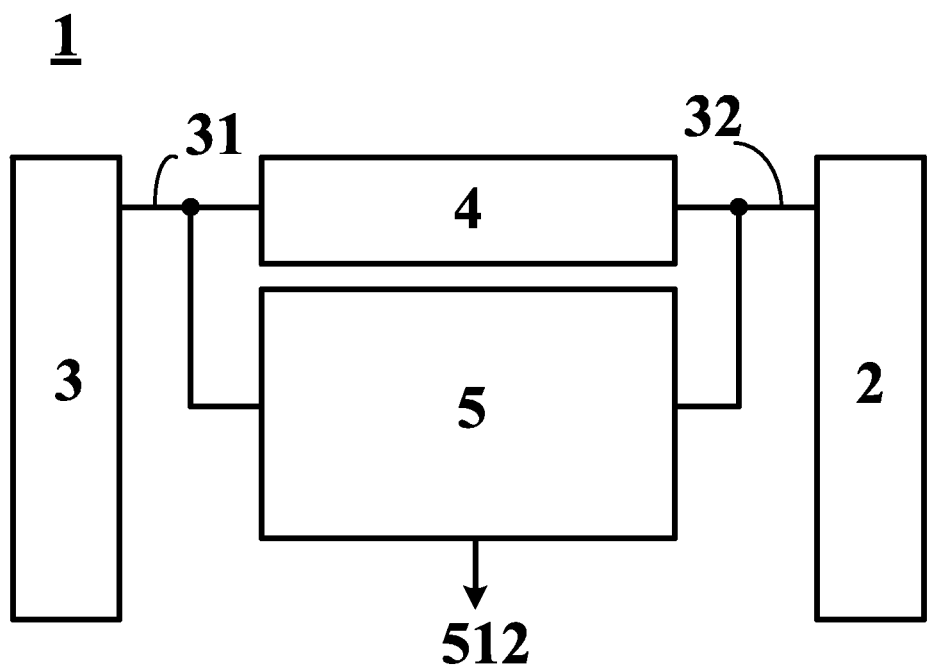
FIG. 1 is a block diagram of the instant disclosure.

Please refer to FIG. 1, which illustrates a block diagram of a diagnostic circuit 1 disclosed by the instant disclosure for inspecting abnormal light-emitting device. The circuit 1 comprises a power source module 3, a buffer module 4, and an abnormality detection module 5. The circuit 1 is employed to inspect a light-emitting device 2 of the printer's printer head for any abnormality. The light-emitting device 2 includes a plurality of light-emitting diodes (LEDs) 21. The power source module 3 provides a first power source signal 31 to the buffer module 4. After being buffered by the buffer module 4, the first power source signal 31 is converted to a second power source signal 32 and transmitted to the light-emitting device 2. A comparison is made between the first power source signal 31 and the second power source signal 32 by the abnormality detection module 5. If the first and second power source signals 31, 32 are identical, the result means the light-emitting device 2 is working normally. Conversely, if the first and second power source signals 31, 32 are different from one another, the result suggests the light-emitting device 2 is acting abnormally. In such cases, a detection output terminal 512 of the abnormality detection module 5 would output an abnormality detection signal. The reason being an abnormal (e.g., damaged), light-emitting device 2 may lead to an open-circuit or other adverse effects on the electrical circuit. Consequently, the electrical circuit signal (i.e., second power source signal 32), measured at the output terminal of the buffer module 4, would be different from the first power source signal 31. In light of this, by comparing the electrical circuit signals at the input and output terminals of the buffer module 4, one can determine whether the light-emitting device 2 is functioning properly.

Figure 2:
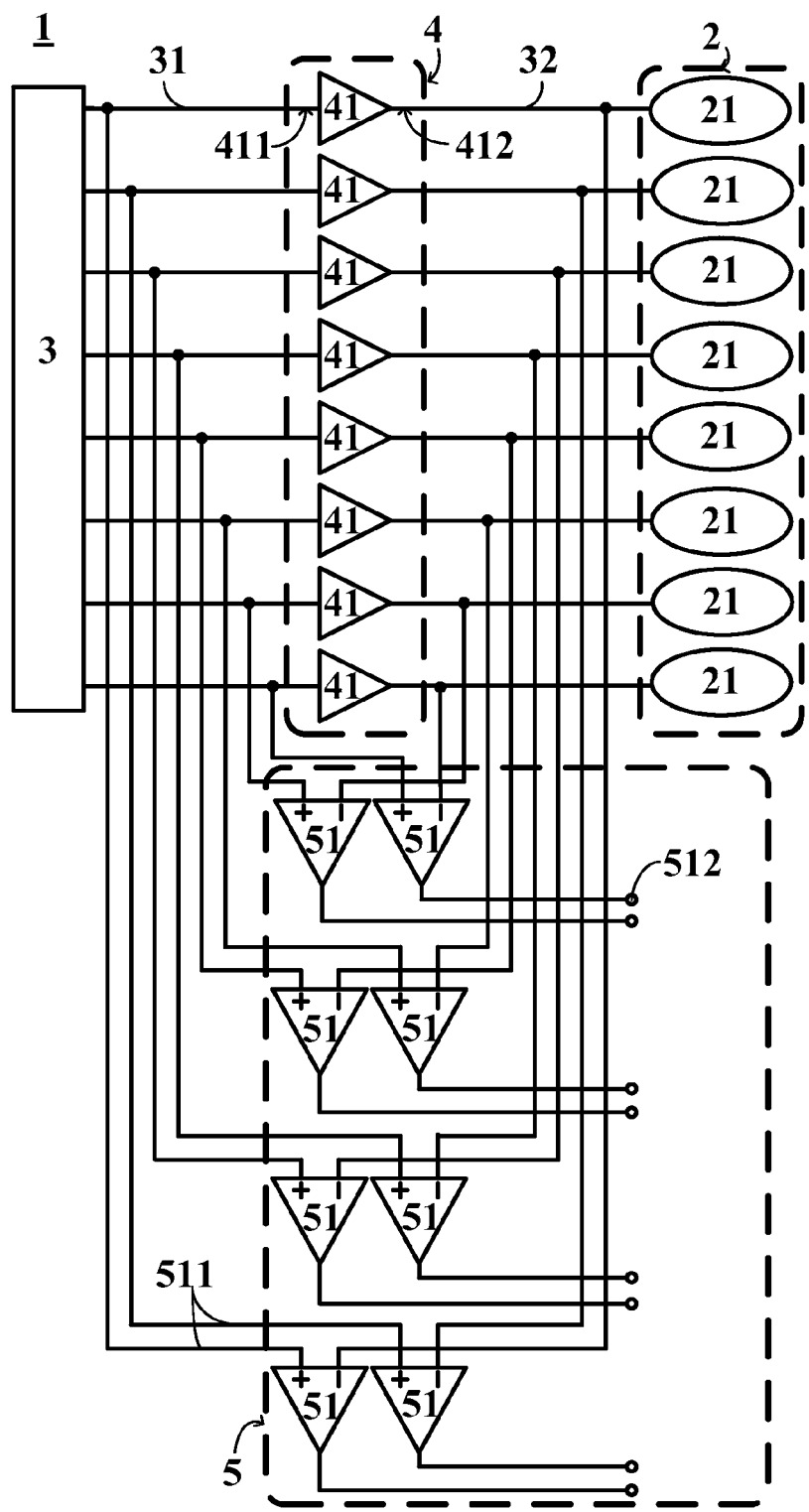
FIG. 2 is a schematic diagram of the diagnostic circuit for a first embodiment of the instant disclosure.

Please refer to FIG. 2, which is a schematic diagram showing the diagnostic circuit 1 for a first embodiment of the instant disclosure. For the purpose of explanation, eight LEDs 21 are inspected. Nevertheless, the number of LEDs is not limited thereto. For example, to attain a printing resolution of 600 DPI (dots per inch), an LED density of 600 LED/inch is needed. The circuit 1 comprises the power source module 3, the buffer module 4, and the abnormality detection module 5. The power source module 3 provides the first power source signal 31 to the buffer module 4.

The buffer module 4 includes a plurality of buffers 41. Each buffer 41 has a buffer input terminal 411 and a buffer output terminal 412. The buffer input terminal 411 is for receiving the first power source signal 31. The buffer output terminal 412 outputs the second power source signal 32 that corresponds to the first power source signal 31 to the assigned LED 21. For the present embodiment, the buffer module 4 includes eight buffers 41. Each buffer 41 receives the first power source signal 31 from the power source module 3 for driving corresponding LED 21. However, the number of buffers 41 of the buffer module 4 is not limited thereto.

The abnormality detection module 5 includes a plurality of comparators 51. Each comparator 51 has a pair of detection input terminals 511 and a detection output terminal 512. One of the detection input terminals 511 is coupled to the buffer input terminal 411 of the corresponding buffer 41. The other detection input terminal 511 is coupled to the buffer output terminal 412 of the same buffer 41. The purpose is to receive and compare the first and second power source signals 31, 32. The comparison result is outputted by the detection output terminal 512. The comparison result stated herein refers to whether the buffer input terminal 411 and the buffer output terminal 412 of the buffer having the same voltage level. For example, when the buffer input terminal 411 and the buffer output terminal 412 have the same voltage levels, the detection output terminal 512 would output a low voltage level (logic 0). Conversely, when the buffer input terminal 411 and the buffer output terminal 412 have different voltage levels, the detection output terminal 512 would output a high voltage level (logic 1). For the present embodiment, the number of comparators 51 for the abnormality detection module 5 corresponds to the number of buffers 41 of the coupled buffer module 4. Eight comparators 51 and eight buffers 41 are included for the present embodiment.

The buffer module 4 may be an integrated circuit (IC), as with the abnormality detection module 5. The aforementioned buffer input terminal 411, buffer output terminal 412, detection input terminals 511, and detection output terminal 512 correspond to the pins of the integrated circuit.

The power source module 3 provides the first power source signals 31 separately to the buffer input terminal 411 of each buffer 41 of the buffer module 4. The first power source signals 31 may all be provided to the buffers 41 at the same time or at different time. Further yet, the first power source signals 31 may only be given to a specific number of buffers 41, per inspection requirements.

For the present embodiment, the comparators 51 are voltage comparators, but are not restricted thereto. For example, current comparators may be used as comparators 51 for detection. The detection would inspect whether the first and second power source signals 31, 32 have the same current intensity, so as to determine whether the LEDs 21 are working properly.

Figure 3:
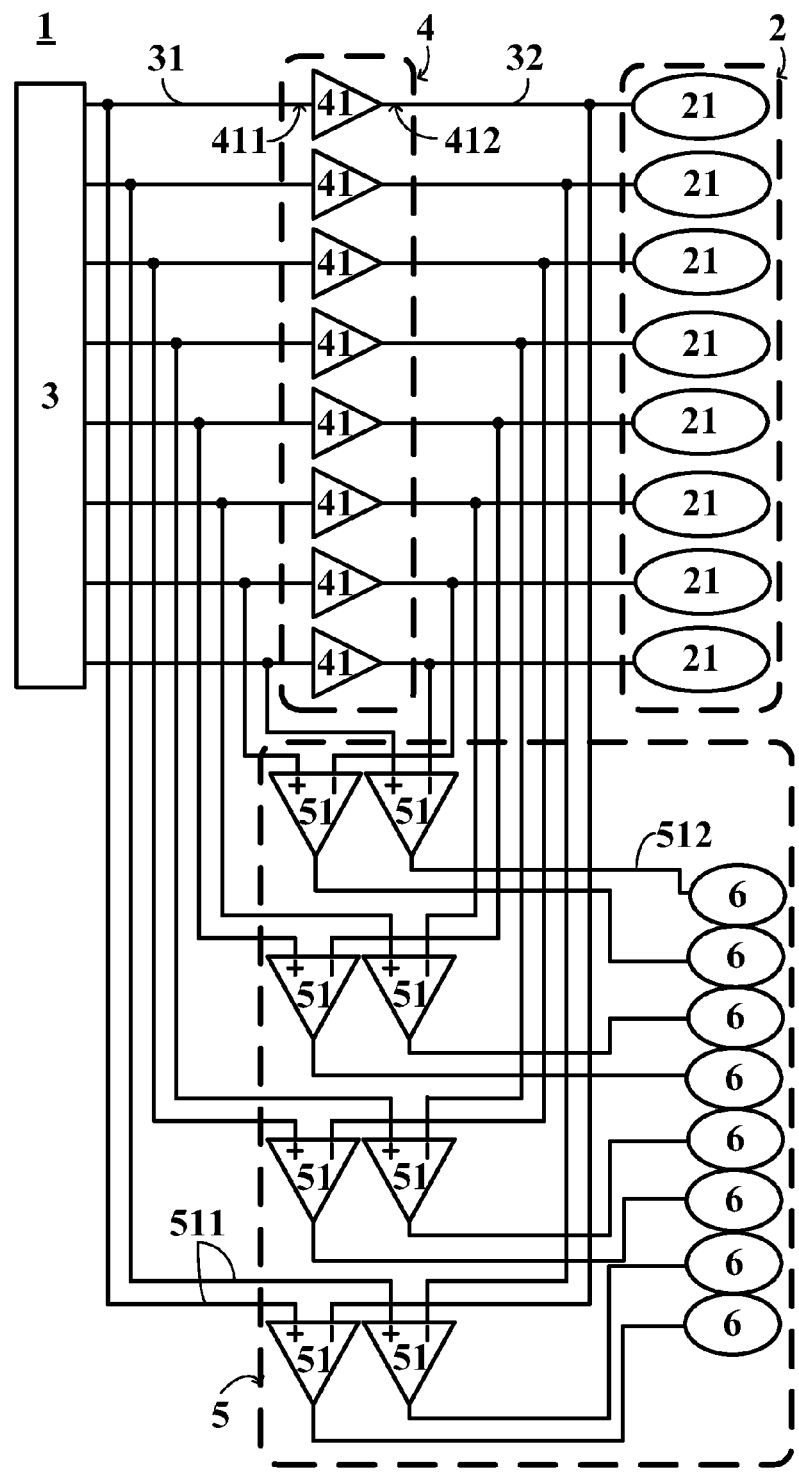
FIG. 3 is a schematic diagram of the diagnostic circuit for a second embodiment of the instant disclosure.

Please refer to FIG. 3, which is a schematic diagram showing the circuit 1 of a second embodiment of the instant disclosure. Relative to the first embodiment, the abnormality detection module 5 further includes a plurality of display units 6. For displaying the diagnostic results, the display units 6 are coupled to the detection output terminal 512 of the respective comparators 51.

Figure 4:
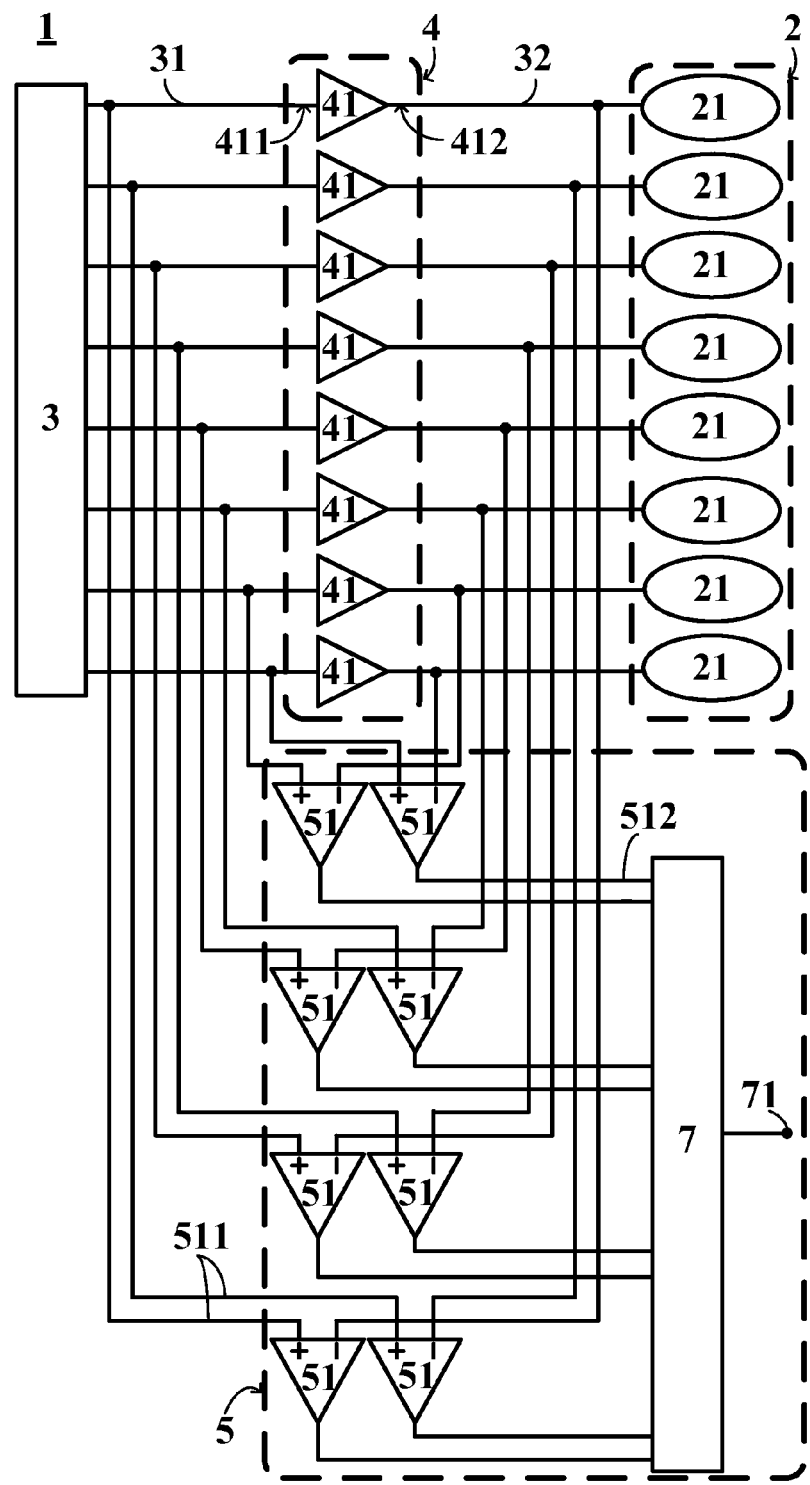
FIG. 4 is a schematic diagram of the diagnostic circuit for a third embodiment of the instant disclosure.
Figure 5:
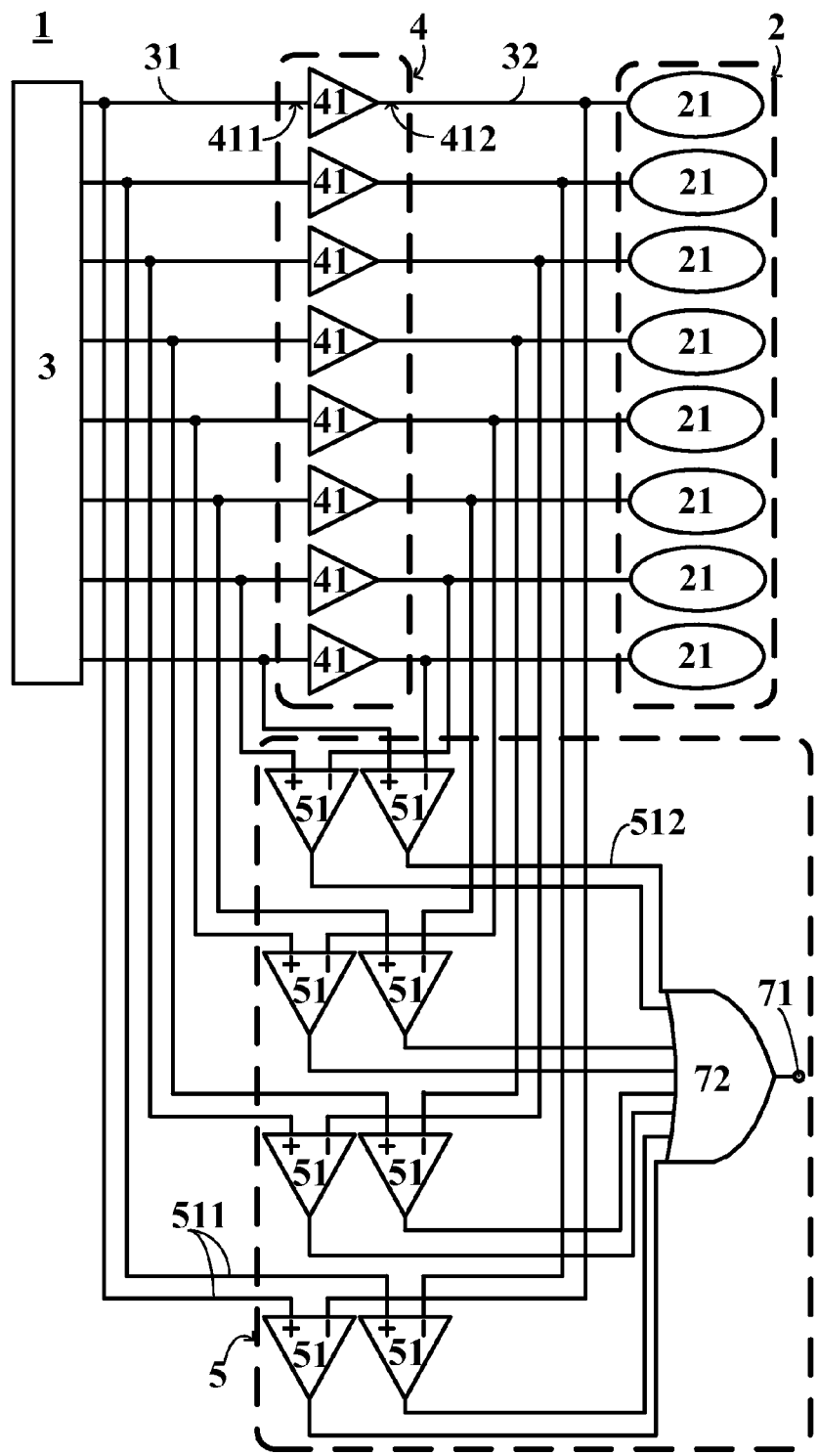
FIG. 5 is a schematic diagram of another diagnostic circuit for the third embodiment of the instant disclosure.

Please refer to FIG. 4, which is a schematic diagram showing the diagnostic circuit 1 of a third embodiment of the instant disclosure. Relative to the first embodiment, the abnormality detection module 5 further includes a logic analyzing unit 7. The logic analyzing unit 7 is coupled to the detection output terminal 512 of each comparator 51. Logic operation is applied to the comparison signals to generate the diagnostic result 71. The logic analyzing unit 7, as shown in FIG. 5, may be an OR gate 72. When the detection output terminal 512 of one comparator 51 outputs a high level, the diagnostic result 71 outputted by the OR gate 72 would be a high level as well. Such a case suggests the LEDs 21 are acting abnormally. By using the OR gate 72, all of the LEDs 21 of the light-emitting device 2 can be examined quickly to determine if any abnormality exists, without checking each LED 21 individually, thus improving inspection efficiency. Only when the diagnostic result 71 shows an abnormality, would each LED 21 need to be inspected individually.

Figure 6:
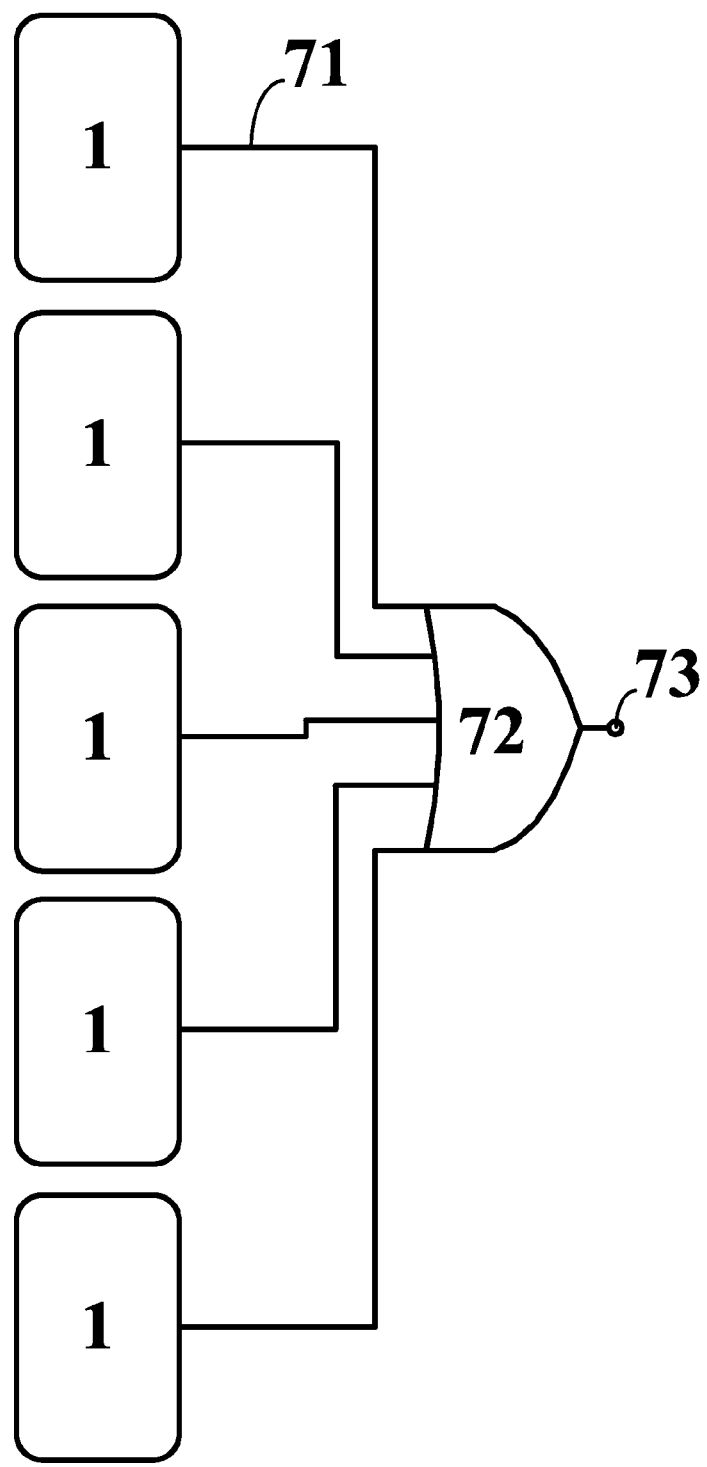
FIG. 6 is a schematic diagram of the diagnostic circuit for a fourth embodiment of the instant disclosure.

Please refer to FIG. 6, which is a schematic diagram showing the diagnostic circuit 1 of a fourth embodiment of the instant disclosure. To enable high volume and high speed diagnostics, the OR gate 72 may be used to group the diagnostic results 71 of all the diagnostic circuits 1, perform the logic operation, and output a final diagnostic result 73. With a such configuration, only when the final diagnostic result 73 shows an abnormality, will each diagnostic circuit 1 be reviewed by the process of elimination to identify the abnormal LED 21. For the purpose of explanation, the present embodiment shows five diagnostic circuits 1 for a single inspection. However, the number of diagnostic circuits 1 is not limited thereto.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A diagnostic circuit, for inspecting a light-emitting device having a plurality of light-emitting elements, comprising:
   a power source module outputting a first power source signal;
   a buffer module including a plurality of buffers, each buffer having:
   a buffer input terminal for receiving the first power source signal; and
   a buffer output terminal for outputting a second power source signal corresponding to the first power source signal to one of the light-emitting elements, wherein when the light-emitting element drove by the second power source signal is acting abnormally, the second power source signal is different from the first power source signal, and when the light-emitting element drove by the second power source signal is working normally, the second power source signal and the first power source signal are identical; and an abnormality detection module including a plurality of comparators, each comparator having:

a pair of detection input terminals, one of the detection input terminals coupling to the buffer input terminal of the corresponding buffer for receiving the first power source signal, the other detection input terminal coupling to the buffer output terminal of the corresponding buffer for receiving the second power source signal; and a detection output terminal outputting a comparison signal, wherein the abnormality detection module outputs a diagnostic result based on the comparison signals of the comparators.

2. The diagnostic circuit of claim 1, wherein each light-emitting element is a light-emitting diode (LED).

3. The diagnostic circuit of claim 1, wherein each comparator is a voltage comparator.

4. The diagnostic circuit of claim 1, wherein each comparator is a current comparator.

5. The diagnostic circuit of claim 1, wherein the buffer module is an integrated circuit.

6. The diagnostic circuit of claim 1, wherein the abnormality detection module is an integrated circuit.

7. The diagnostic circuit of claim 1, wherein the abnormality detection module includes a plurality of display units, and wherein each display unit is coupled to the detection output terminal of the corresponding comparator, for displaying the diagnostic result of the comparison signal of each comparator.

8. The diagnostic circuit of claim 1, wherein the abnormality detection module further includes a logic analyzing unit, and wherein the logic analyzing unit is coupled to the detection output terminal of each comparator, for subjecting comparison signals to logic operation in generating a final diagnostic result.

9. The diagnostic circuit of claim 8, wherein the logic analyzing unit is an OR gate.

* * * * *